United States Patent [19]

Fajt et al.

[11] 4,378,033

[45] Mar. 29, 1983

[54] APPARATUS AND METHOD FOR SEPARATING AND CUTTING LEAD WIRES OF LAMPS

[75] Inventors: John Fajt; James V. Neal, Jr., both of Wynnewood, Okla.

[73] Assignee: Xenell Corporation, Wynnewood, Okla.

[21] Appl. No.: 186,447

[22] Filed: Sep. 12, 1980

[51] Int. Cl.³ .............................................. B21F 1/02
[52] U.S. Cl. ..................................... 140/139; 83/17; 83/176; 83/909; 140/147
[58] Field of Search ................. 140/1, 139, 140, 147; 83/17, 176, 909; 29/25.18, 25.19

[56] References Cited

U.S. PATENT DOCUMENTS

| | | | |
|---|---|---|---|
| 1,208,846 | 12/1916 | Sheldon et al. | 294/100 |
| 1,453,493 | 5/1923 | Cunningham | 294/86.14 |
| 1,646,258 | 10/1927 | Raus et al. | 140/71.5 |
| 1,861,271 | 5/1932 | Herre | 140/71.5 |
| 2,121,665 | 6/1938 | Hudson | 219/4 |
| 2,137,181 | 11/1938 | Quackenbush | 219/57 |
| 2,203,151 | 6/1940 | Iversen | 219/4 |
| 2,379,135 | 6/1945 | Ekstedt et al. | 140/71.5 |
| 2,449,505 | 9/1948 | Pityo et al. | 219/4 |
| 2,454,338 | 11/1948 | Pityo et al. | 219/4 |
| 2,459,625 | 1/1949 | Copp | 219/4 |
| 2,477,894 | 8/1949 | Pityo et al. | 219/4 |
| 2,493,560 | 1/1950 | Vasselli | 140/147 |
| 2,578,835 | 12/1951 | Pityo et al. | 219/4 |
| 2,605,537 | 8/1952 | Pityo et al. | 29/33 |
| 2,606,268 | 8/1952 | Pityo et al. | 219/10 |
| 2,644,069 | 6/1953 | Pityo | 219/4 |
| 2,734,119 | 2/1956 | Pityo | 219/10 |
| 2,749,420 | 6/1956 | Pityo | 219/4 |
| 2,784,297 | 3/1957 | Pityo | 219/78 |
| 2,798,514 | 7/1957 | Mullan | 140/71.5 |
| 2,846,561 | 8/1958 | Pityo | 219/79 |
| 2,848,793 | 8/1958 | Pityo | 29/155.5 |
| 2,915,616 | 12/1959 | Griffin | 219/159 |
| 2,916,056 | 12/1959 | O'Brien et al. | 140/71.5 |
| 2,936,797 | 5/1960 | Mullan et al. | 140/71.5 |
| 3,003,051 | 10/1961 | Kulicke, Jr. et al. | 219/56.1 |
| 3,003,052 | 10/1961 | Williams et al. | 219/101 |
| 3,005,900 | 10/1961 | Pityo | 219/79 |
| 3,045,739 | 7/1962 | Fyfe et al. | 153/2 |
| 3,059,321 | 10/1962 | Pityo | 29/155.5 |
| 3,071,166 | 1/1963 | Gutbier | 140/1 |
| 3,075,562 | 1/1963 | Jankowski | 140/147 |
| 3,079,958 | 3/1963 | Helda | 140/147 |
| 3,106,945 | 10/1963 | Wright et al. | 221/93 |
| 3,144,889 | 8/1964 | Cole | 140/140 |
| 3,195,584 | 7/1965 | Zimmerman et al. | 140/147 |
| 3,220,443 | 11/1965 | Smith et al. | 140/147 |
| 3,225,797 | 12/1965 | Stoody | 140/147 |
| 3,258,830 | 7/1966 | Pityo | 316/1 |
| 3,286,323 | 11/1966 | Bastiaanse | 29/25.19 |
| 3,291,168 | 12/1966 | Zitner | 29/155.55 |
| 3,294,948 | 12/1966 | Fegley et al. | 219/56.1 |
| 3,300,617 | 1/1967 | Buck et al. | 219/117 |
| 3,319,668 | 5/1967 | Shambelan | 140/147 |
| 3,321,606 | 5/1967 | Cropp et al. | 219/79 |
| 3,321,825 | 5/1967 | Cooke . | |
| 3,337,257 | 8/1967 | Brynsvold | 294/90 |
| 3,344,816 | 10/1967 | Zemek | 140/147 |
| 3,352,331 | 11/1967 | Swyt | 140/147 |
| 3,396,758 | 8/1968 | Hall | 140/1 |
| 3,479,712 | 11/1969 | Pityo . | |
| 3,517,157 | 6/1970 | Best et al. . | |
| 3,520,336 | 7/1970 | Zemek | 140/147 |
| 3,537,276 | 11/1970 | Pityo . | |
| 3,542,087 | 11/1970 | Fegley | 140/147 |
| 3,612,254 | 10/1971 | Wideman | 198/179 |
| 3,778,584 | 12/1973 | Fajt et al. . | |
| 3,837,472 | 9/1974 | Byerly | 198/218 |
| 3,850,286 | 11/1974 | Tobin, Jr. | 198/210 |
| 3,935,773 | 2/1976 | Daebler . | |
| 3,941,165 | 3/1976 | Bowden et al. | 140/147 |
| 4,002,191 | 1/1977 | Lorenzini | 140/147 |
| 4,024,614 | 5/1977 | Utterback et al. | 228/4.5 |
| 4,049,414 | 9/1977 | Smith | 65/11 |
| 4,094,410 | 6/1978 | Fegley et al. | 209/73 |

OTHER PUBLICATIONS

Publication of Kahle Engineering Company of Union City, N.J., Machine Number 4719, Automatic Stem Machine.
Publication of Kahle Engineering Company of Union City, N.J., Machine Number 2545, Automatic Pinch Seal Stem Machine.
Publication of Kahle Engineering Company of Union City, N.J., Machine Number 4318, Neon Glow Lamp Production Machine.
Publication of Kahle Engineering Company of Union City, N.J., Machine Number 15-B, Twenty-four Head Exhaust Machine With Short Compressible Rubbers.
Publication of Kahle Engineering Company of Union City, N.J., Brochure No. 6903, entitled "Kahle Specialists In Automation For All Industries".
Publication of Kahle Engineering Company of Union City, N.J., Bulletin REP 70.
Publication of Kahle Engineering Company of Union City, N.J., Reprint from Automation, Sep. 1971, entitled "Combining Processing and Assembly Operations", by Carl A. Napor.
Publication of Kahle Engineering Company of Union City, N.J., Reprint from Instrumentation, vol. 7, No. 6, entitled "Slick Little Switch".

*Primary Examiner*—James M. Meister
*Attorney, Agent, or Firm*—Laney, Dougherty, Hessin & Beavers

[57] ABSTRACT

An apparatus for separating first and second lead wires of an electrical component and cutting one of the lead wires to a predetermined length includes a separator blade having a first shearing edge thereon. The separator blade is attached to a carrier assembly for moving the separator blade between the first and second lead wires to separate the lead wires. A length adjustment assembly is operably associated with the separator blade for moving the electrical component relative to the separator blade to a relative position such that the first shearing edge of the separator blade is adjacent a point at which the one lead wire is to be cut. A cutter assembly is operably associated with the separator blade and has a second shearing edge thereon. The cutter assembly is movable from a first position wherein the one lead wire to be cut is located between the first and second shearing edges and a second position such that the second shearing edge passes across the first shearing edge when it moves from the first position to the second position, thereby cutting the one lead wire between the first and second shearing edges.

20 Claims, 17 Drawing Figures

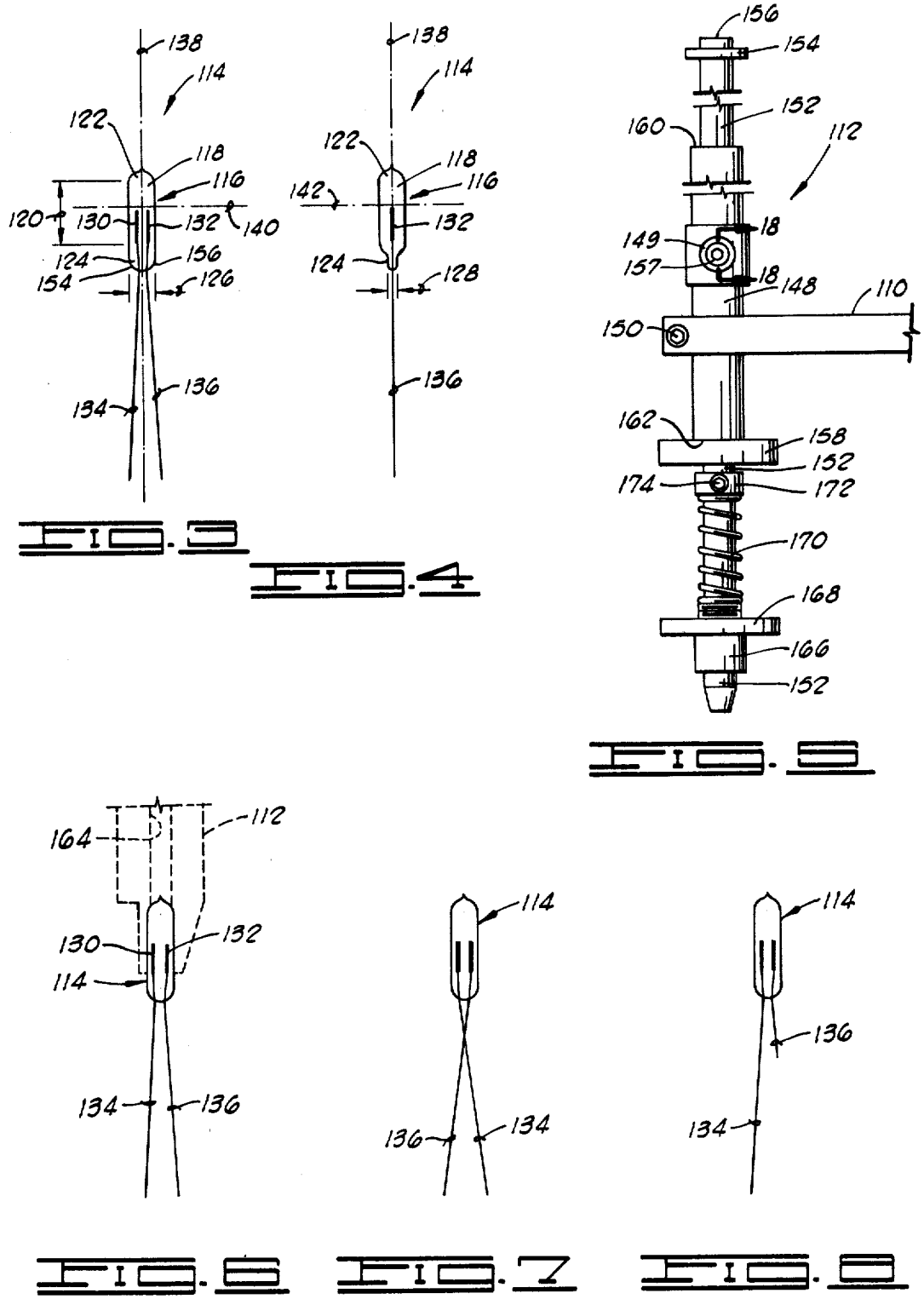

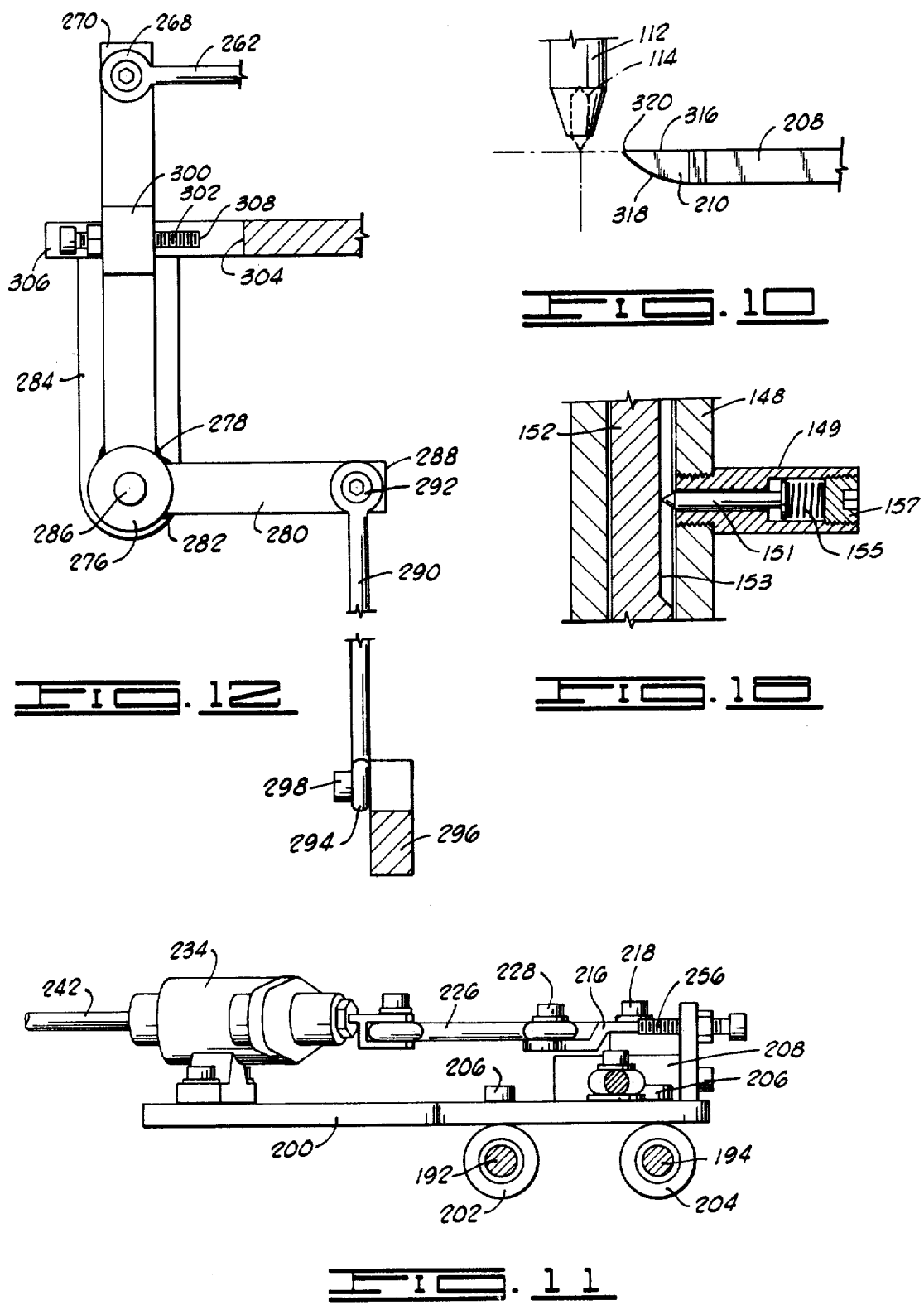

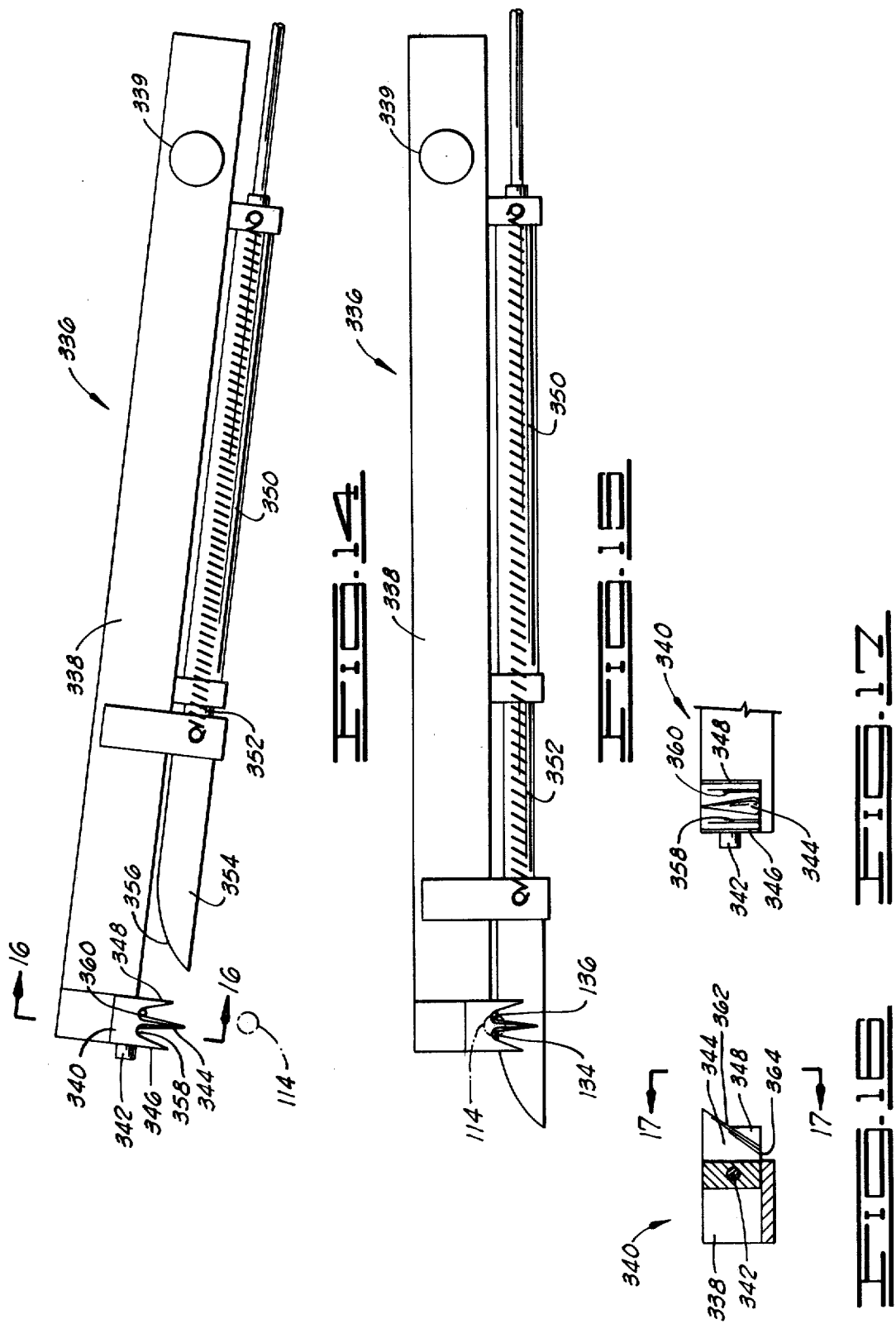

1

APPARATUS AND METHOD FOR SEPARATING AND CUTTING LEAD WIRES OF LAMPS

BACKGROUND OF THE INVENTION

1. Field of the Invention

The present invention relates generally to apparatus and methods for separating and cutting lead wires of an electrical component, and more particularly, but not by way of limitation, to such apparatus and methods for use with negative glow lamps.

2. Description of the Prior Art

A negative glow lamp is an electrical component having a cylindrical glass bulb approximately ½ inch in length and ¼ inch in diameter. Extending downwardly from the bulb is a lower bulb portion which is a substantially flat tab formed during the bulb manufacturing process. This lower bulb portion extends downward approximately ¼ inch and has a width of approximately ¼ inch and a thickness of approximately 1/16 inch. Disposed within the bulb are first and second filaments. Attached to the first and second filaments and extending downwardly from the lower bulb portion are first and second copper lead wires having a length of approximately 1½ inches. These lead wires are substantially parallel and lie substantially in the plane of the flat tab extending down from the bulb.

Such negative glow lamps are used in large numbers by manufacturers of electrical equipment. Various modifications are often made to the lamps such as custom trimming of the lead wires to a specific length and/or the welding of a resistor to one of the lead wires.

During the handling of these lamps, the lead wires thereof are often bent or otherwise deformed so that they no longer extend straight and parallel from the bulb and are often crossed with each other. It is therefore necessary to separate the lead wires before additional operations, such as the trimming of the length of the lead wire, can be performed.

Prior to the present invention, such separation of the lead wires has been performed manually and then the lead wire to be cut has been inserted manually in a cutting machine.

The present invention provides apparatus and methods for automatically separating the lead wires and cutting one of the lead wires to a predetermined length.

SUMMARY OF THE INVENTION

An apparatus for separating first and second lead wires of an electrical component and cutting one of the lead wires to a predetermined length includes a separator blade having a first shearing edge thereon. The separator blade is attached to a carrier assembly for moving the separator blade between the first and second lead wires to separate the lead wires. A length adjustment assembly is operably associated with the separator blade for moving the electrical component relative to the separator blade to a relative position such that the first shearing edge of the separator blade is adjacent a point at which the one lead wire is to be cut. A cutter assembly is operably associated with the separator blade and has a second shearing edge thereon. The cutter assembly is movable from a first position wherein the one lead wire to be cut is located between the first and second shearing edges and a second position such that the second shearing edge passes across the first shearing edge when it moves from the first position to the second position, thereby cutting the one lead wire between the first and second shearing edges.

It is therefore a general object of the present invention to provide apparatus and methods for separating lead wires of an electrical component.

Another object of the present invention is the provision of apparatus and methods for separating lead wires of an electrical component and cutting one of the lead wires to a predetermined length.

And another object of the present invention is the provision of apparatus and methods for separating lead wires of a negative glow lamp.

Yet another object of the present invention is the provision of apparatus and methods for separating lead wires of a negative glow lamp and cutting one of said lead wires to a predetermined length.

And another object of the present invention is the provision of a separator blade and means for moving the separator blade between first and second lead wires of an electrical component to separate the same.

Yet another object of the present invention is the provision of a separator blade for separating lead wires of an electrical component, and the provision of length adjustment means and cutter means both operably associated with the separator blade for positioning the electrical component relative to the separator blade and cutting one of the lead wires thereof to a predetermined length.

Other and further objects, features and advantages of the present invention will be readily apparent to those skilled in the art upon a reading of the following disclosure when taken in conjunction with the accompanying drawings.

BRIEF DESCRIPTION OF THE DRAWINGS

FIG. 3 is a side elevation view of a negative glow lamp with the plane of the paper being defined by first and second body axes of the negative glow lamp.

FIG. 4 is a side elevation view of the negative glow lamp of FIG. 3, rotated 90° clockwise as viewed from above about its first body axis, so that the plane of the paper is defined by the first and third body axes of the negative glow lamp.

FIG. 5 is a side elevation view of one of the indexing arms and its associated lamp holder.

FIG. 6 is an elevation view of a negative glow lamp oriented as seen in FIG. 3 when viewed from a position looking radially inward toward the center of the turntable of FIG. 1, and held in place within the lamp holder of FIG. 5 which is shown in phantom lines.

FIG. 7 is similar to FIG. 6 and illustrates an example of the way the lead wires of the negative glow lamp may be crossed or otherwise deformed.

FIG. 8 illustrates the negative glow lamp after the lead wires have been separated and the second lead wire has been cut to a predetermined length.

FIG. 10 is a rear side elevation view along line 10—10 of FIG. 9 illustrating the position of the separator blade relative to a lamp held in the lamp holder.

FIG. 11 is an outer elevation section view along line 11—11 of FIG. 9 illustrating the manner in which the separator-cutter carrier plate is slidably mounted relative to the table frame of the automatic welding turntable of FIG. 1.

FIG. 12 is a front elevation section view approximately along 12—12 of FIG. 9 showing the actuating linkage which slides the separator-cutter carrier plate on the parallel support bars.

FIG. 14 is a plan view of an alternative embodiment of a separator mechanism.

FIG. 15 is a view similar to FIG. 14 showing the apparatus of FIG. 14 inserted between and separating the lead wires of a lamp.

FIG. 16 is a side elevation view along line 16—16 of FIG. 14 showing the elevation profile of the separator blade of the alternative embodiment.

FIG. 17 is a view along line 17—17 of FIG. 16.

FIG. 18 is a view along line 18—18 of FIG. 5.

DETAILED DESCRIPTION OF THE PREFERRED EMBODIMENTS

Figure 1:
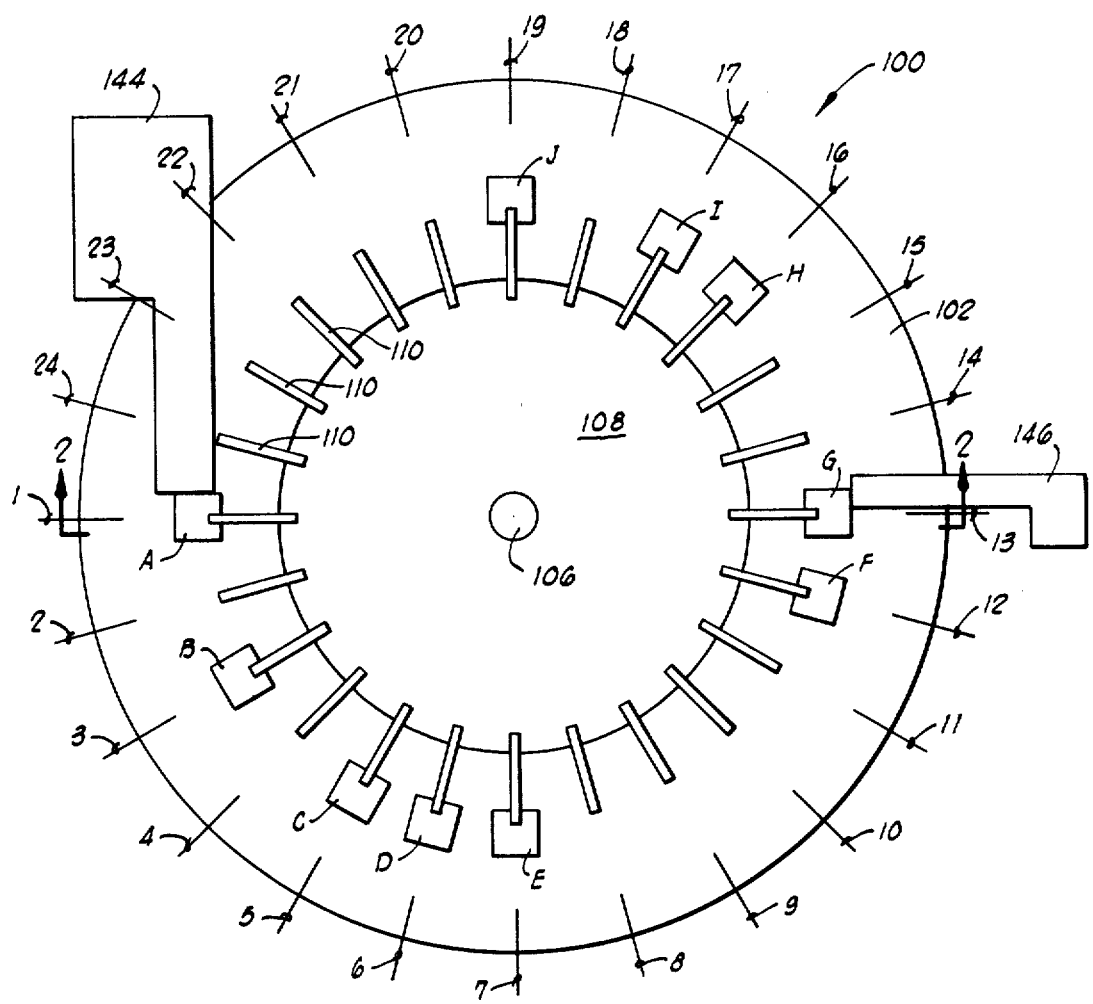
FIG. 1 is a schematic plan view of an automatic welding turntable of which the lamp wire separating and cutting apparatus of the present invention is a part.

Referring now to FIG. 1, an automatic welding turntable assembly is shown and generally designated by the numeral 100. The turntable assembly 100 includes a fixed circular table frame 102 supported from a ground surface by a structural frame 104 (see FIG. 2). Extending upward from the center of table frame 102 is a rotatable shaft 106. Attached to the shaft 106 for rotation therewith is a circular indexing plate 108.

Extending radially outward from indexing plate 108 are twenty-four equally angularly spaced indexing arms 110. Thus, adjacent indexing arms 110 are separated by an angle of 15°.

Attached to the rotatable shaft 106 is a drive means (not shown) which provides a means for periodically rotating the shaft 106 through an angle of 15° in a counterclockwise direction as viewed in FIG. 1, then holding rotatable shaft 106 fixed for a period of time, then rotating shaft 106 through a second angle of 15°, then stopping again, etc. Thus, it takes twenty-four steps for any one of the indexing arms 110 to mark a complete revolution relative to the table frame 102.

At any given time at which the rotatable shaft 106 is stopped, the indexing arms 110 are oriented as shown in FIG. 1 relative to the table frame 102.

Twenty-four angular positions of the indexing arms 110 relative to the table frame 102 are defined on the table frame 102 and are indicated by angular positions 1-24 shown in FIG. 1.

Figure 2:
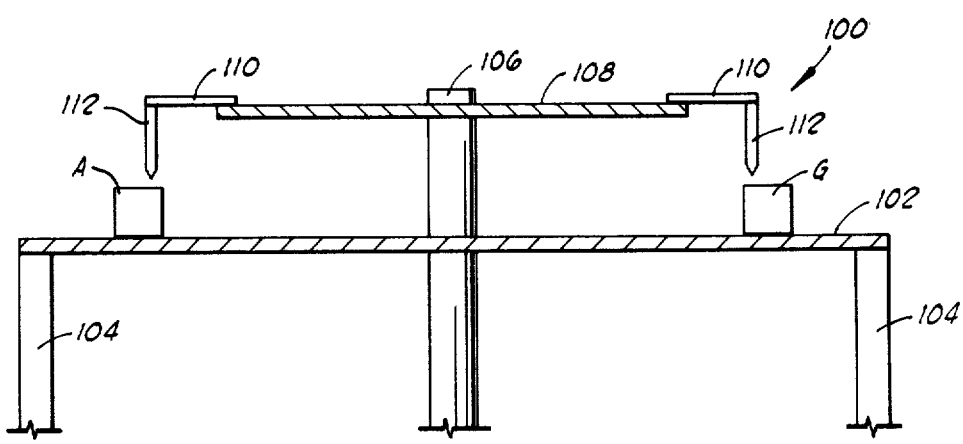
FIG. 2 is a schematic elevation view of the automatic welding turntable of FIG. 1 taken along line 2—2 of FIG. 1.

Each of the indexing arms 110 includes a lamp holder means 112, as shown schematically in FIG. 2.

Referring now to FIGS. 3 and 4, a negative glow lamp 114 is thereshown. The negative glow lamp 114, which itself is known in the prior art, will now be described for purposes of reference. The negative glow lamp 114 includes a bulb 116. The bulb 116 has a cylindrical portion 118 having a length 120 of approximately ¼ inch. The cylindrical portion 118 has an outside diameter, which is its greatest minimum cross-sectional dimension, of approximately ¼ inch. It will be understood that for any section cut through the bulb 16 perpendicular to its longitudinal axis there will be a minimum cross-sectional dimension. The greatest of these minimum cross-sectional dimensions determines the smallest width of a slot through which the bulb 116 could pass.

At the upper end of cylindrical part 118 is a roughly conical closed tip 122 which is formed during the bulb manufacturing process.

Extending downward from the lower end of cylindrical part 118 is a flat bottom bulb portion 124 which closes the bottom of hollow cylindrical part 118. Flat bottom bulb portion 124 has a width 126 of approximately ¼ inch and has a thickness 128, as can best be seen in FIG. 4, of approximately 1/16 inch.

Received within the bulb 116 are first and second filaments 130 and 132. The filaments 130 and 132 are substantially parallel and spaced apart as can be seen in FIG. 3. Attached to the filaments 130 and 132 are first and second lead wires 134 and 136 which extend downward through the flat bulb portion 124. Lead wires 134 and 136 extend downward a length of approximately 1½ inch below bulb 116. The lead wires 134 and 136 are encased in lower part 124 of bulb 116 where they pass therethrough, and are substantially parallel to each other and lie within the plane of filaments 130 and 132 and the plane of lower bulb portion 124. It will be understood by those skilled in the art, that the lead wires 134 and 136 will, of course, often be slightly bent away from each other or out of the plane of FIG. 3. The construction of the lamp 114 is, however, such that if the lead wires 134 and 136 are not deformed, but rather extend axially from the filaments 130 and 132, they will be substantially parallel to each other and lie in the plane of flat bottom bulb portion 124 and in the plane of filaments 130 and 132.

This is further illustrated in FIG. 4, in which the lamp 114 is rotated 90° about a vertical axis from the view shown in FIG. 3, so that only the second filament 132 and the second lead wire 136 are shown.

The geometric configuration of the lamp 114 may best be described by defining first, second and third mutually perpendicular body axes of the lamp 114. Those axes, which will be understood as being imaginary axes, are defined as follows.

A longitudinal axis through cylindrical part 118 of lamp bulb 116 is defined as a first body axis 138. Perpendicular to axis 138 and lying in a plane defined by filaments 130 and 132 and lower flat bulb portion 124 is a second body axis 140. The axes 138 and 140 define the plane of the paper on which FIG. 3 is drawn.

A third body axis 142 is perpendicular to both said first and second axes 138 and 140 and may be seen in FIG. 4 where the axes 138 and 142 define the plane of the paper on which FIG. 4 is drawn.

As can be seen in FIG. 3, the first and second lead wires 134 and 136 extend from lower bulb portion 124 substantially parallel to first body axis 138 and spaced apart in a direction parallel to second axis 140.

Referring again to FIG. 1, at several of the angular positions upon table frame 102 work stations A–J are defined for performing various operations on a negative glow lamp as it is carried around the automatic welding turntable 100 by one of the lamp holders 112.

At work station A, lamps 114 are fed to a predetermined position in space by a lamp positioning assembly 144 and at work station A each of the lamps is picked up by one of the lamp holders 112.

At work station B an apparatus is provided for separating the lead wires 134 and 136 and trimming the second lead wire 136 to a predetermined length. The present invention is comprised of the apparatus at work station B and associated other parts of the automatic welding turntable assembly 100 which position the lamps 114 at work station B.

Additional operations performed at work stations C through J adjust the vertical position of the lamp holder 112 at work station C, trim the length of the first lead wire 134 at work station D, straighten the second lead wire 136 at work station E, sense the presence of the lamp 114 at work station F, weld a resistor to second lead wire 136 at work station G, trim the length of a second resistor lead wire at work station H, test the physical strength of the weld at work station I, and release the lamp 114 at work station J.

At work station G a resistor feeder means 146 also feeds resistors to the welding machine at work station G.

The separator-cutter assembly located at work station B, which with certain associated apparatus of the automatic welding turntable assembly 100 for positioning the lamps 114 at work station B comprises the present invention, will now be described in more detail.

Referring to FIG. 5 one of the lamp holders 112 attached to one of the indexing arms 110 is thereshown.

The lamp holder 112 includes a friction tube 148 which is fixedly clamped to indexing arm 110 by an allen screw 150 which tightens a split end (not shown) of indexing arm 110 about friction tube 148.

Slidably received within friction tube 148 is a center rod 152 which has a friction fit within friction tube 148 so that the vertical position of center rod 152 within friction tube 148 is maintained in the absence of any vertical force other than gravity being applied to the center rod 152. In other words, when the center rod 152 is moved to a given position relative to friction tube 148, that position is maintained until the center rod 152 is mechanically engaged and pushed to another position within the friction tube 148.

The structure for providing this friction fit is illustrated in FIG. 18, which is a view along line 18—18 of FIG. 5. A handle 149 extends horizontally from friction tube 148. Disposed within handle 149 is a plunger 151 which is biased into a groove 153 of center rod 152 by a compression spring 155 which abuts set screw 157. Plunger 151 is constructed from a rigid fibrous material similar to that from which automobile brake linings are constructed.

An upper retaining ring 154 is fixedly attached to center rod 152 near its upper end 156 and a lower retaining ring 158 is fixedly attached to center rod 152 at an intermediate part thereof. Vertical movement of center rod 152 within friction tube 148 is limited at its downwardmost and upwardmost extents by engagement of the upper and lower retaining rings 154 and 158 with upper and lower ends 160 and 162, respectively, of friction tube 148.

The lower end of center rod 152 has a central bore 164 therein as may be seen in FIG. 6. That lower end is also split axially to form a plurality of downwardly extending cantilevered fingers.

Slidingly disposed about center rod 152 is a cam sleeve 166. An actuating ring 168 is attached to and extends radially outward from cam sleeve 166. Engaging an upper end of cam sleeve 166 is a coil compression spring 170, the upper end of which abuts a retaining ring 172 which is fixed in place relative to center rod 152 by set screw 174.

Defined upon a cylindrical inner surface of cam sleeve 166 is a downward outwardly tapered cam surface (not shown) which engages radially outward extending protrusions from the finger portions of the lower end of center rod 152 so that when cam sleeve 166 is forced downward by spring 170 to the position shown in FIG. 5, the split fingers on center rod 152 are urged radially inward so as to clamp about a lamp 114 if the same is in place within the center bore 164 thereof.

At work station A of FIG. 1, the cam sleeve 166 is moved upward relative to center rod 152 as to allow the spring fingers to spring outward and a lamp 114 is placed within the center rod 152 in a manner such that its first body axis is vertically oriented, its second body axis 140 is oriented tangentially to an arc through which the lamp 114 is carried by the lamp holder 112, and its third body axis 142 is oriented along a radius of table frame 102.

When lamp holder 112 indexes to work station B a lamp 114 is held in place therein as shown in FIG. 6 when viewed from a position radially outward from work station B facing inward towards the rotatable shaft 106.

It will be understood by those skilled in the art, that due to the handling of the lamps 114 prior to their positioning at work station B, the lead wires 134 and 136 will not necessarily be straight as shown in FIG. 6, but may for example be crossed as shown in FIG. 7.

The separator and cutting apparatus at work station B will separate crossed wires such as shown in FIG. 7 and then trim the second lead wire 136 to a predetermined length as shown in FIG. 8.

Figure 9:
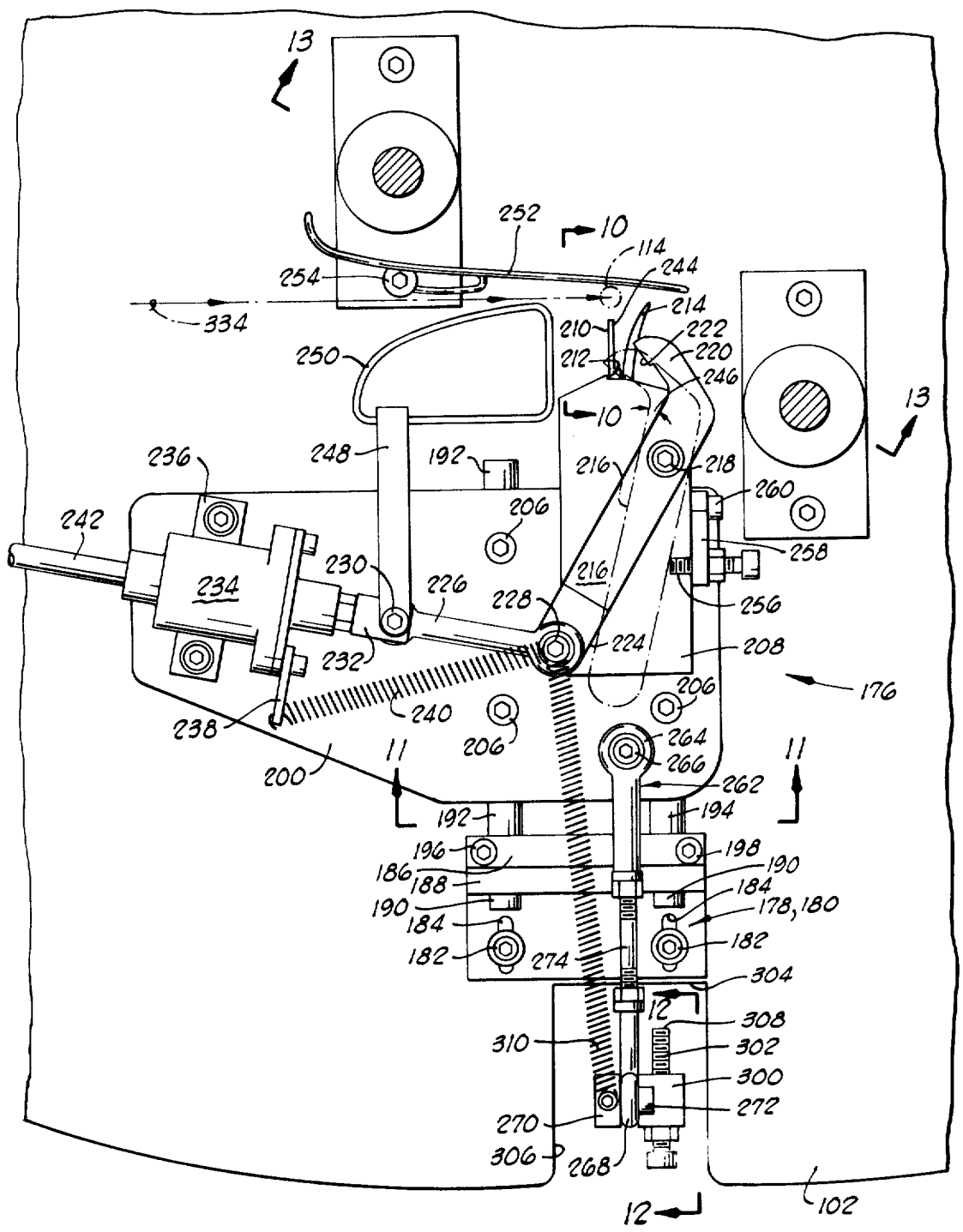
FIG. 9 is a plan view of a separator-cutter located at work station B of FIG. 1, showing the separator-cutter in its retracted position as it is oriented at the beginning of a cycle.

Referring to FIG. 9, the lamp lead wire separator-cutter is generally designated by the numeral 176. FIG. 9 is a plan view of the spreader cutter 176 mounted upon the table frame 102 at work station B at angular position 3 as seen in FIG. 1.

An angle-shaped mounting bracket 178 has a horizontal leg 180 attached to table frame 102 by allen screws 182 which extend through slots 184 into threaded holes in the table frame 102 so that the position of the mounting bracket 178 may be adjusted.

A rod holder plate 186 is attached to a vertical leg 188 of mounting bracket 178 by allen screws 190 which extend through vertical leg 188 into threaded bores in rod holder plate 186.

First and second parallel horizontally extending cylindrical rods 192 and 194 are attached to holder plate 186 by clamping within bores thereof by means of clamping screws 196 and 198 which tighten split (not shown) ends at each end of holder plate 186.

A separator-cutter carrier plate 200 is slidably mounted upon rods 192 and 194 by means of cylindrical bushings 202 and 204 which are attached to carrier plate 200 by allen screws 206. The bushings 202 and 204 are best seen in FIG. 11, which is a sectional view along line 11—11 of FIG. 9.

Fixedly attached to carrier plate 200 is a cutter block 208. A separator blade 210 is mounted in a notch 212 in the innermost end of cutter blade 208.

Also attached to the innermost end of cutter block 208 adjacent separator blade 210 is a lamp lead wire guide finger 214.

A cutter arm 216 is pivotally attached to the top surface of cutter block 208 by pivot screw 218. The innermost end of cutter arm 216 has a bent portion 220 which has a shearing edge 222 thereon.

The outermost end 224 of cutter arm 216 has a cutter actuating linkage 226 attached thereto by pivot screw 228. The other end of cutter actuating linkage 226 is pivotally attached at pivot screw 230 to a U-shaped bracket 232 attached to the end of a piston of an air cylinder 234. The air cylinder 234 is mounted upon separator-cutter carrier plate 200 by a mounting bracket 236. A spring attachment ear 238 extends outward from air cylinder 234, and a cutter return spring 240 is connected between ear 238 and pivot screw 228 on cutter arm 216.

Compressed air is supplied to air cylinder 234 by a hose 242.

When the separator-cutter 176 is in a position to trim one of the lead wires on a negative glow lamp, as will be further explained below, compressed air is directed to the cylinder 234 and the piston thereof is extended thereby moving linkage 226 and pivoting cutter arm 216 counterclockwise as seen in FIG. 9 about the pivot screw 218 so that the shearing edge 222 moves across a shearing edge 244 of separator blade 210 thereby cutting the second lead wire 136 of the lamp 114 between shearing edge 222 of cutter 216 and shearing edge 244 of separator blade 210. During that movement, the cutter arm 216 rotates through an angle 246 of approximately 10° as shown by the phantom lines defining the actuated position of cutter arm 216.

A bracket 248 is attached to U-shaped bracket 232 and extends inward. The inward end of bracket 248 has an outer lamp lead wire guide frame 250 attached thereto. As is further discussed below, the outer guide frame 250 assists in the proper positioning of the lamp lead wires.

An inner lead wire guide frame 252 is attached to table frame 102 by mounting bolt 254.

When cutter arm 216 is pivoted to the cutting position shown in phantom lines in FIG. 9, the counterclockwise motion of cutter arm 216 is limited by engagement of the cutter arm 216 with an adjustable bolt 256 which is attached to an adjustment holder frame 258 which is in turn attached to cutter block 208 by allen screws such as 260.

Attached to separator-cutter carrier plate 200 is a separator actuating linkage 262. Separator actuating linkage 262 has an innermost end 264 which is attached to the carrier plate 200 by pivot screw 266.

Separator actuating linkage 262 includes an outer end 268 which is attached to a vertical actuating bar 270 by an allen screw 272.

Separator actuating linkage 262 further includes a middle portion 274 connected to the inner and outer ends 264 and 268 by oppositely oriented threads so that the length of linkage 262 may be adjusted by rotation of the middle part 274.

In FIG. 12, which is a section elevation view along line 12—12 of FIG. 9, the vertical actuating bar 270 is better shown. Actuating bar 270 is rigidly attached to a cylindrical pivot sleeve 276 at weld 278. A horizontal arm 280 is also rigidly attached to pivot sleeve 276 at weld 282. Pivot sleeve 276 is pivotally attached to a downward extending support bracket 284 by pivot pin 286. An inner end 288 of horizontal arm 280 is attached to a vertical linkage 290 at pivot pin 292. A lower end 294 of vertical linkage 290 is attached to an actuating bar 296 by pivot screw 298.

The actuating bar 296 has one end (not shown) pivotally attached to the supporting framework 104 of table frame 102, and is moved up and down in a pivotal motion by a cam (not shown) attached to a primary camshaft (not shown) which coordinates the movement of all the various components of automatic welding turntable 100.

An adjustment holder block 300 is attached to the forward side of vertical actuating bar 270 and has an adjustment bolt 302 disposed therethrough for engagement with a radially innermost edge 304 of a cut out portion 306 of the table frame 102. Engagement of an inner end 308 of adjustment bolt 302 with edge 304 limits radially inward movement of separator actuating linkage 262.

A coil tension spring 310 is connected between an upper end of vertical actuating bar 270 and the pivot pin 228 on cutter arm 216 to merely take the slack out of the linkage connected to separator actuating linkage 262.

Figure 13:
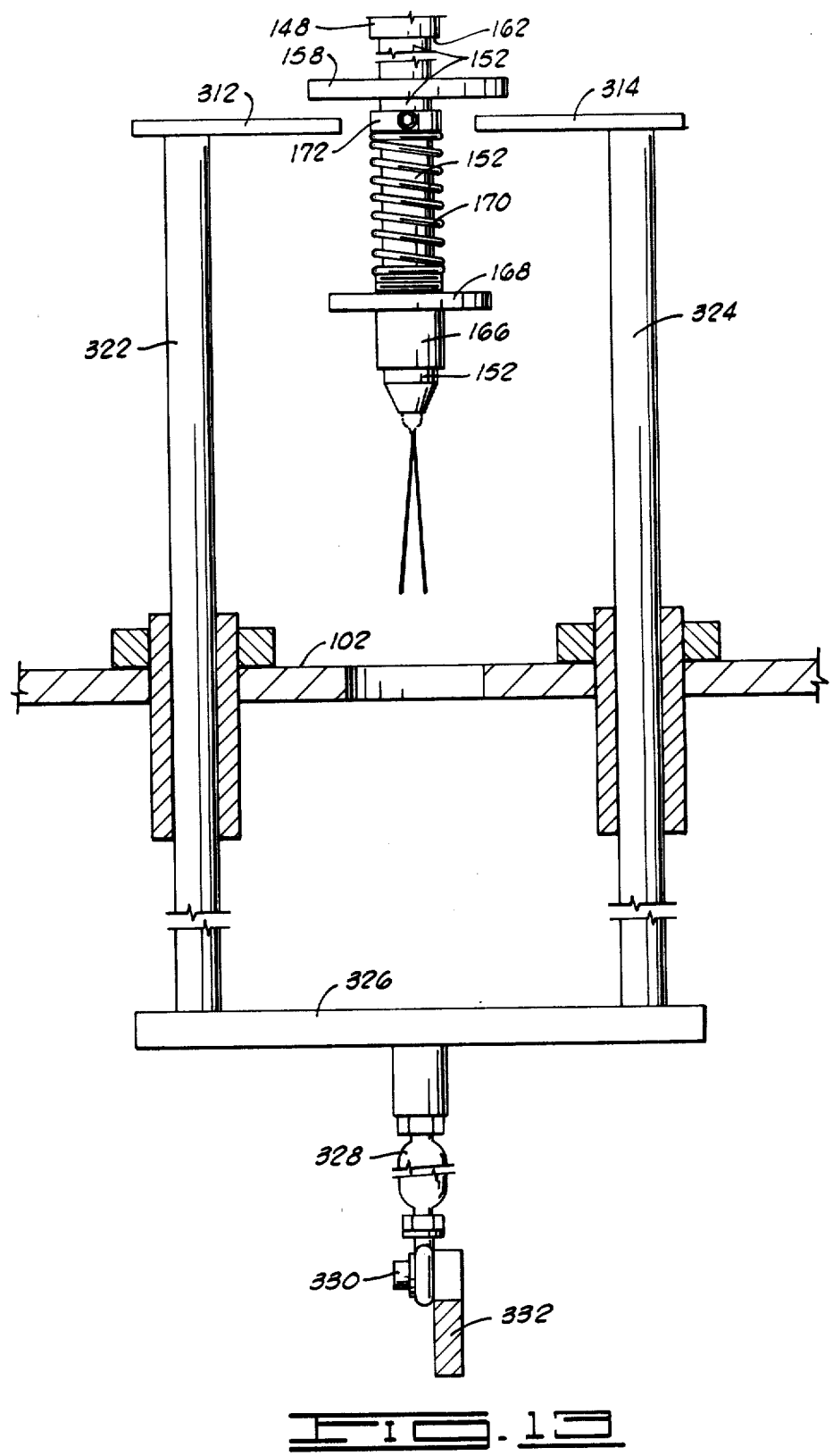
FIG. 13 is a section view along line 13—13 of FIG. 9 illustrating the positioning arms which position the lamp holder means to adjust the length to which the lead wire is cut. The actuating linkage for those positioning arms is also shown.

Referring now to FIG. 13, a section elevation view along line 13—13 of FIG. 9 shows length adjustment arms 312 and 314 arranged for engagement with the lower retaining ring 158 of lamp holder 112.

As previously described, the center rod 152 of lamp holder 112 is friction fit within a friction tube 148 so that its vertical position is maintained once it is moved vertically within the friction tube.

When the lamp holder 112 reaches angular position 3 it is in the same position at which it left angular position 1 so that the lower retaining ring 158 is located a considerable distance below the lower end 162 of friction tube 148.

As is best shown in FIG. 10, which is a view along line 10—10 of FIG. 9, the spreader blade 210 is located at an elevation such that a top surface 316 thereof is located only slightly below the bottom tip of the glass bulb 116 of the lamp 114 carried by lamp holder 112.

Shearing edge 244 is defined on the right side (as viewed in FIG. 9) of top surface 316. Blade 210 has a curved lower surface 318 which meets top surface 316 at a tip 320. When the lamp 114 is held at angular position 3, the carrier plate 200 moves inward on slide rods 192 and 194 and blade 210 is inserted tip first between lead wires 134 and 136 thereby separating the same.

The adjustment of the length to which the second lamp lead wire is to be cut may then be made by raising the entire lamp holder center rod 152 within its friction tube 148 by means of the length adjustment arms 312 and 314 which engage lower retaining ring 158 on its bottom surface.

Length adjustment arms 312 and 314 are attached to the upper ends of actuating rods 322 and 324, the lower ends of which are commonly attached to a cross member 326. Thus the arms 312 and 314 are maintained at identical elevations. The cross member 326 is attached to an adjustable length vertical linkage 328 which is pivotally attached at pivot pin 330 to a second horizontal actuating bar 332 which is pivotally attached to the support frame 104 for table frame 102 in a manner similar to that previously described for bar 296 and which is also driven by the main camshaft as also previously described for bar 296. The length to which the second lead wire 136 of lamp 114 is to be cut may be adjusted by adjusting the length of vertical linkage 328, thereby adjusting the height to which the length adjustment arms 312 and 314 are carried.

OPERATION OF THE SEPARATOR-CUTTER

The general manner of operation of the spreader-cutter 176 is as follows.

When the indexing arm 110 and lamp holder 112 carry a lamp 114 from the angular position 2 to position 3, it travels through a path approximately along the line 334 shown in FIG. 9 to a position as shown in phantom lines for the lamp 114 when the indexing arm is stopped at angular position 3. Initially, the separator-cutter 176 is in the position illustrated in FIG. 9. The lamp holder 112 is at the same elevation at which it left angular position 1. The length adjustment arms 312 and 314 are at a lowermost position out of contact with and below the lower retaining ring 158 of lamp holder 112.

As the lamp 114 moves through the path 334, the lead wires 134 and 136 thereof, if the same happened to be bent radially inward or outwardly from the lamp 114, are guided toward a vertically downward position by engagement with the inner and outer lamp lead wire guide frames 252 and 250. If the lamp lead wires are bent in a forward direction from the lamp 114, they will engage lamp wire guide finger 214 which extends inward from cutter block 208 so as to also guide the lamp lead wires toward a vertically downward position from the lamp 114.

Once the lamp 114 is stopped at angular position 3, the horizontal actuating bar 296 shown in FIG. 12 is moved downward by the main camshaft thereby pulling vertical link 290 downward and pivoting horizontal arm 280 and vertical actuating arm 270 clockwise as shown in FIG. 12 about pivot pin 286. This pushes the separator actuating linkage 262 radially inward as seen in FIG. 9 so that separator-cutter carrying plate 200 slides inward upon the parallel bars 192 and 194 thereby moving the separator blade 210 inward between the lead wires 134 and 136 of lamp 114.

After separator blade 210 has been inserted between the lamp lead wires 134 and 136, the horizontal actuating bar 332 (see FIG. 13) moves upwardly thereby moving the actuating rods 322 and 324 and their accompanying length adjustment arms 312 and 314 upward into engagement with the lower retaining ring 158 of lamp holder 112 thereby moving the center rod 152 of lamp holder 112 upward within the friction tube 148 to a desired position such that shearing edge 244 of separator blade 210 is adjacent a point at which second lead wire 136 is to be cut. The lamp lead wires 134 and 136 are still located on opposite sides of separator blade 210.

Then a micro-switch (not shown) is actuated by the primary camshaft (not shown) and opens a solenoid valve (not shown) to direct compressed air to air cylinder 236 causing cutter arm 216 to pivot to the position shown in phantom lines in FIG. 9, thereby trimming the second lamp lead wire 136 to a desired length as shown in FIG. 8.

Then the length adjustment arms 312 and 314 move downward out of engagement with the lamp holder 112 and the micro-switch opens closing the solenoid valve thereby cutting off the supply of air to cylinder 234 which allows return spring 240 to rotate cutter arm 216 back to the position shown in solid lines in FIG. 9. At the same time, the separator-cutter carrier plate 200 is moved radially outward along the parallel rods 192 and 194.

That completes the work cycle at work station C at angular position 3 and the lamp 114 is then ready to be moved to the next work station.

ALTERNATIVE EMBODIMENT OF A SEPARATOR

In its broader aspects, the present invention comprises a mechanism for separating the lead wires 134 and 136 of a lamp 114, and it will be appreciated that such a separating mechanism may be a necessary precedant to operations other than the cutting of the lead wires.

An alternative embodiment of a separating mechanism, which does not include a cutting mechanism, is illustrated in FIGS. 14 through 17.

FIG. 14 is a plan view of an alternative separator apparatus generally designated by the numeral 336. The separator apparatus 336 is shown in position relative to a lamp 114 illustrated in phantom lines in the position in which it would be held by a holder means similar to that previously described.

The separator 336 includes a horizontal arm 338 which has a separator insert 340 attached to the left end thereof by attachment screw 342. Arm 338 is attached to a pivotable vertical support rod 339.

Separator insert 340 includes a longer middle separator blade 344 which is inserted between the lead wires 134 and 136 of the lamp 114.

Separator insert 340 also includes two shorter outer blades 346 and 348. When the separator 336 moves forward from the position shown in FIG. 14 to the position shown in FIG. 15 relative to the lamp 114, by counter-clockwise rotation of support rod 339, the middle separator blade 344 is inserted between the lamp lead wires which are disposed respectively between the two shorter blades 346 and 348 and the middle blade 344.

The separator 336 also includes an air cylinder 350 which is attached to a side thereof. A piston 352 extends from air cylinder 350 and has a cam blade 354 attached thereto. Cam blade 354 is shaped in profile much like a conventional knife blade as seen in FIGS. 14 and 15, but it will be understood as further described below that a curved portion 356 of cam blade 354 is not sharp, but rather functions as a cam to align the lead wires 134 and 136 of the lamp 114 at roots 358 and 360 of separator insert 340.

After the horizontal arm 348 has pivoted forward from the position shown in FIG. 14 to the position shown in FIG. 15, the lamp lead wires are disposed on opposite sides of separator blade 344. Then cam blade 354 is moved to the left relative to horizontal arm 338 by extension of piston 352 thereby causing the lamp lead wires to be moved into the roots 358 and 360 of separator insert 340 as may be seen in FIG. 15.

The separator 336 may then be moved downward relative to the lamp holder 112, by vertical downward movement of support rod 339, so as to straighten the entire length of lead wires 134 and 136 of lamp 114.

Then cam blade 354 retracts and arm 338 pivots back to the original position of FIG. 14, moving out of engagement with the lamp 114.

FIG. 16 shows a view along line 16—16 of FIG. 14 which shows the side elevation profile of separator blade 344. FIG. 17 shows a front elevation view of separator insert 340.

As can be seen in FIGS. 16 and 17, the middle blade 344 has a sloped lower surface 362 which thickens toward the bottom 364 of insert 340.

Thus it is seen that the apparatus and methods for separating lead wires of an electrical component and for cutting one of said lead wires to a predetermined length readily achieves the ends and advantages mentioned as well as those inherent therein. While certain preferred embodiments of the present invention have been illustrated for the purpose of this disclosure, numerous changes in the arrangement and construction of parts may be made by those skilled in the art, which changes are encompassed within the scope and spirit of this invention as defined by the appended claims.

What is claimed is:

1. An apparatus for separating first and second lead wires of an electrical component and cutting one of said lead wires to a predetermined length, comprising:

a separator blade having a first shearing edge thereon;

carrier means, attached to said separator blade, for moving said separator blade between said first and second lead wires to separate said first and second lead wires;

length adjustment means, operably associated with said separator blade, for moving said electrical component relative to said separator blade to a relative position such that said first shearing edge of said separator blade is adjacent a point at which said one lead wire is to be cut; and cutter means operably associated with said separator blade and having a second shearing edge thereon and being movable from a first position wherein said one lead wire to be cut is located between said first and second shearing edges and a second position such that said second shearing edge passes across said first shearing edge when it moves from said first position to said second position thereby cutting said one lead wire between said first and second shearing edges.

2. The apparatus of claim 1, wherein:

said separator blade has a straight upper surface, with said first shearing edge being an edge of said upper surface, and has a curved lower surface converging to meet said straight upper surface at a tip.

3. The apparatus of claim 2, wherein:

said separator blade is so arranged and constructed that when said carrier means moves said separator blade between said lead wires said tip is the first part of said blade to separate said lead wires.

4. The apparatus of claim 1, further comprising:

a main frame; and wherein said carrier means includes a carrier frame slidably mounted on said main frame, said separator blade being attached to said carrier frame.

5. The apparatus of claim 4, wherein:

said cutter means is mounted upon said carrier frame.

6. The apparatus of claim 5, wherein said cutter means further comprises:

a cutter arm pivotally attached to said carrier frame and having said second shearing edge disposed thereon;

a biasing spring connected between said cutter arm and said carrier frame for urging said cutter arm toward a first position corresponding to said first position of said cutter means; and a fluid power cylinder mounted on said carrier frame and connected to said cutter arm for moving said cutter arm to a second position corresponding to said second position of said cutter means.

7. The apparatus of claim 1, wherein said length adjustment means includes:

a first holder part fixed in elevation relative to said separator blade;

a second holder part operably associated with and variable in elevation relative to said first holder part, said second holder part including a means for holding said electrical component; and a vertically movable actuating arm for engaging said second holder part and moving said second holder part and said electrical component to a desired elevation relative to said separator blade so that said first shearing edge of said separator blade is adjacent said point at which said one lead wire is to be cut.

8. An apparatus for cutting lead wire of a lamp, said lamp being of the type including:

a bulb;

a lower bulb portion extending from said bulb in a direction parallel to a first axis of said bulb, said lower bulb portion having a width in a direction parallel to a second axis of said bulb, and a thickness less then said width in a direction parallel to a third axis of said bulb, said first, second and third bulb axes being mutually perpendicular; and first and second lead wires extending from said lower bulb portion substantially parallel to said first bulb axis and spaced apart in a direction parallel to said second axis;

said apparatus comprising:

separator blade means for separating said first and second lead wires, said separator blade means having a first shearing edge thereon;

carrier means, attached to said separator blade means, for moving said separator blade means between said first and second lead wires to separate said first and second lead wires;

length adjustment means, operably associated with said separator blade means, for moving said lamp relative to said separator blade means to a relative position such that said first shearing edge of said separator blade means is adjacent a point at which said one lead wire is to be cut; and cutter means operably associated with said separator blade means and having a second shearing edge thereon and being movable from a first position wherein said one lead wire to be cut is located between said first and second shearing edges and a second position such that said second shearing edge passes across said first shearing edge when it moves from said first position to said second position thereby cutting said one lead wire between said first and second shearing edges.

9. A lamp wire cutting system, comprising:

a plurality of lamps, each of said lamps including:

a bulb;

a lower bulb portion extending from said bulb in a direction parallel to a first axis of said bulb, said lower bulb portion having a width in a direction parallel to a second axis of said bulb, and a thickness less than said width in a direction parallel to a third axis of said bulb, said first, second and third bulb axes being mutually perpendicular; and first and second lead wires extending from said lower bulb portion substantially parallel to said first bulb axis and spaced apart in a direction parallel to said second axis;

a main frame;

holder means, connected to said frame, for sequential holding each of said lamps at a predetermined position relative to said frame;

separator blade means for separating said first and second lead wires of each of said lamps when each of said lamps is held at said predetermined position by said holder means, said separator blade means having a first shearing edge thereon;

carrier means, attached to said separator blade means, for moving said separator blade means between said first and second lead wires to separate said first and second lead wires;

actuating means, operably associated with said separator blade means and said holder means, for moving said holder means and said lamp relative to said separator blade means to a relative position such that said first shearing edge of said separator blade means is adjacent a point at which said one lead wire is to be cut; and cutter means operably associated with said separator blade means and having a second shearing edge thereon and being movable from a first position wherein said one lead wire to be cut is located between said first and second shearing edges and a second position such that said second shearing edge passes across said first shearing edge when it moves from said first position to said second position thereby cutting said one lead wire between said first and second shearing edges.

10. The system of claim 9, wherein:
said separator blade means has a straight upper surface, with said first shearing edge being an edge of said upper surface, and has a curved lower surface converging to meet said straight upper surface at a tip.

11. The system of claim 10, wherein:
said separator blade means is so arranged and constructed that when said carrier means moves said separator blade means between said lead wires said tip is the first part of said separator blade means to separate said lead wires.

12. The system of claim 9, wherein:
said carrier means includes a carrier frame slidably mounted on said main frame, said separator blade means being attached to said carrier frame.

13. The system of claim 12, wherein:
said cutter means is mounted upon said carrier frame.

14. The system of claim 13, wherein said cutter means further comprises:
a cutter arm pivotally attached to said carrier frame and having said second shearing edge disposed thereon;
a biasing spring connected between said cutter arm and said carrier frame for urging said cutter arm toward a first position corresponding to said first position of said cutter means; and
a fluid power cylinder means on said carrier frame and connected to said cutter arm for moving said cutter arm to a second position corresponding to said second position of said cutter means.

15. The system of claim 9, wherein:
said holder means includes a first holder part fixed in elevation relative to said separator blade, and a second holder part operably associated with and variable in elevation relative to said first holder part, said second holder part including a means for holding said lamp; and
said actuating means includes a vertically movable actuating arm for engaging said second holder part and moving said second holder part and said lamp to a desired elevation relative to said separator blade means so that said first shearing edge of said separator blade means is adjacent said point at which said one lead wire is to be cut.

16. A method of separating first and second lead wires of an electrical component and cutting one of said lead wires to a predetermined length, comprising:
inserting a separator blade having a first shearing edge thereon between said first and second lead wires;
thereby separating said first and second lead wires;
then moving said electrical component relative to said separator blade to a relative position such that said first shearing edge of said separator blade is adjacent a point at which said one lead wire is to be cut; and
moving a cutter means, having a second shearing edge thereon from a first position wherein said one lead wire to be cut is located between said first and second shearing edges to a second position, such that said second shearing edge passes across said first shearing edge when it moves from said first position to said second position;
thereby cutting said one lead wire between said first and second shearing edges.

17. The method of claim 16, wherein:
said inserting step is further characterized in that said separator blade has a straight upper surface with said first shearing edge being an edge of said upper surface and has a curved lower surface converging to meet said straight upper surface at a tip, and said blade is inserted tip first between said first and second lead wires with said straight upper surface closely adjacent a body of said electrical component.

18. A method of separating lamp lead wires, comprising:
sequentially positioning in a predetermined position in space a plurality of lamps of the type including:
a bulb;
a lower bulb portion extending from said bulb in a direction parallel to a first axis of said bulb, said lower bulb portion having a width in a direction parallel to a second axis of said bulb, and a thickness less than said width in a direction parallel to a third axis of said bulb, said first, second and third bulb axes being mutually perpendicular; and
first and second lead wires extending from said lower bulb portion substantially parallel to said first bulb axis and spaced apart in a direction parallel to said second axis, a length of each of said first and second lead wires being substantially greater than a spacing, parallel to said second axis, between said lead wires immediately adjacent said lower bulb portion;
moving a separator blade, in a direction parallel to said third bulb axis, between said first and second lead wires of each of said lamps when each of said lamps is positioned at said predetermined position;
thereby separating said first and second lead wires; and
wherein said inserting step is further characterized in that said separator blade has a straight upper surface and a curved lower surface converging to meet said straight upper surface at a tip, and said blade is inserted tip first between said first and second lead wires with said straight upper surface closely adjacent said lower bulb portion.

19. A method of separating lamp lead wires and cutting one of said lead wires to a predetermined length, comprising:

sequentially positioning in a predetermined position in space a plurality of lamps of the type including:
- a bulb;
- a lower bulb portion extending from said bulb in a direction parallel to a first axis of said bulb, said lower bulb portion having a width in a direction parallel to a second axis of said bulb, and a thickness less than said width in a direction parallel to a third axis of said bulb, said first, second and third bulb axes being mutually perpendicular; and
- first and second lead wires extending from said lower bulb portion substantially parallel to said first bulb axis and spaced apart in a direction parallel to said second axis;

moving a separator blade, in a direction parallel to said third bulb axis, between said first and second lead wires of each of said lamps when each of said lamps is positioned at said predetermined position;

thereby separating said first and second lead wires;

moving said lamp parallel to said first bulb axis and relative to said separator blade to a relative position such that a first shearing edge located on said separator blade is adjacent a point at which said one lead wire is to be cut; and moving a cutter means, having a second shearing edge thereon from a first position wherein said one lead wire to be cut is located between said first and second shearing edges to a second position, such that said second shearing edge passes across said first shearing edge when it moves from said first position to said second position;

thereby cutting said one lead wire between said first and second shearing edges.

20. The method of claim 19, wherein:

said inserting step is further characterized in that said separator blade has a straight upper surface with said first shearing edge being an edge of said upper surface and has a curved lower surface converging to meet said straight upper surface at a tip, and said blade is inserted tip first between said first and second lead wires with said straight upper surface closely adjacent a body of said electrical component.

* * * * *